(12) United States Patent
Jang

(10) Patent No.: US 7,943,461 B2
(45) Date of Patent: May 17, 2011

(54) HIGH-VOLTAGE SEMICONDUCTOR DEVICE AND METHOD FOR MANUFACTURING THE SAME

(75) Inventor: Duck Ki Jang, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 378 days.

(21) Appl. No.: 12/152,831

(22) Filed: May 16, 2008

(65) Prior Publication Data
US 2008/0283911 A1 Nov. 20, 2008

(30) Foreign Application Priority Data

May 16, 2007 (KR) .................. 10-2007-0047440

(51) Int. Cl.
*H01L 21/8238* (2006.01)

(52) U.S. Cl. .................. 438/224; 257/E21.63

(58) Field of Classification Search .................. 257/344, 257/E21.63; 438/197, 595, 223, 224
See application file for complete search history.

(56) References Cited

U.S. PATENT DOCUMENTS

| 7,456,662 | B2 * | 11/2008 | Okamura | 327/52 |
| 7,745,882 | B2 * | 6/2010 | Kim | 257/370 |
| 2008/0283915 | A1 * | 11/2008 | Jang | 257/344 |

\* cited by examiner

*Primary Examiner* — Quoc D Hoang

(74) *Attorney, Agent, or Firm* — The Law Offices of Andrew D. Fortney; Andrew D. Fortney

(57) ABSTRACT

A high-voltage semiconductor device and a method for manufacturing the same are disclosed. The disclosed high-voltage semiconductor device includes a semiconductor substrate, a first N type well in the semiconductor substrate, a first P type well in the first N type well, second N type wells in the first N type well along a periphery of the first P type well, a gate insulating film and a gate electrode on the first P type well, and first heavily-doped N type impurity regions in the first P type well at opposite sides of the gate electrode.

18 Claims, 11 Drawing Sheets

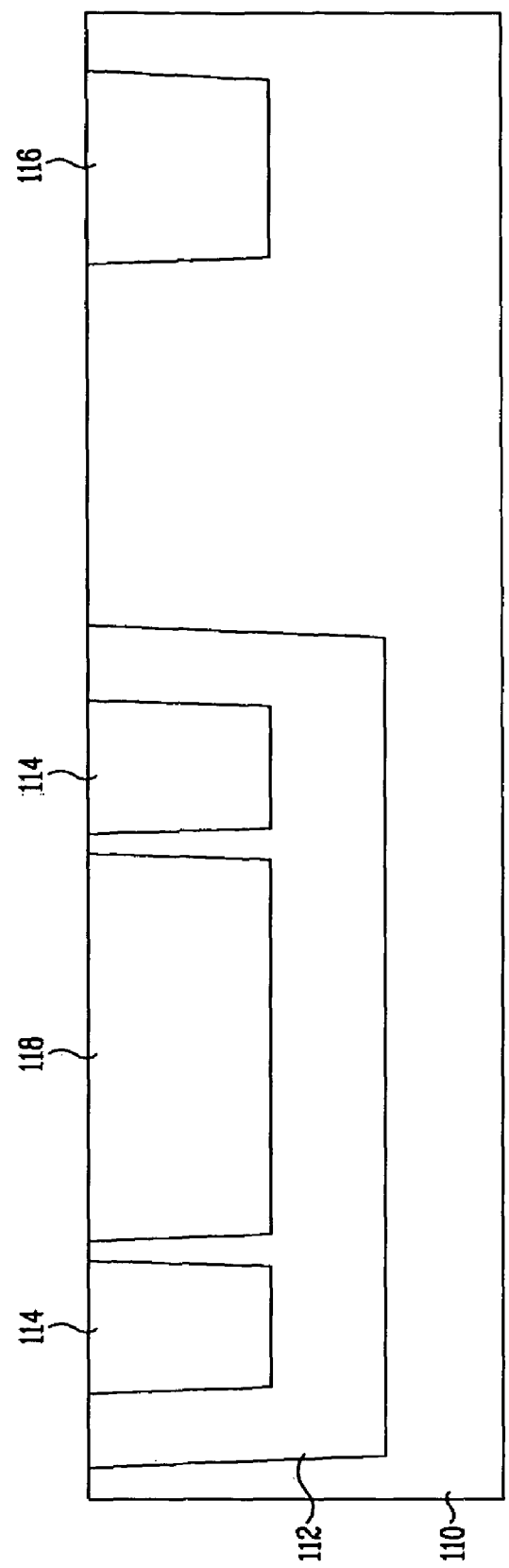

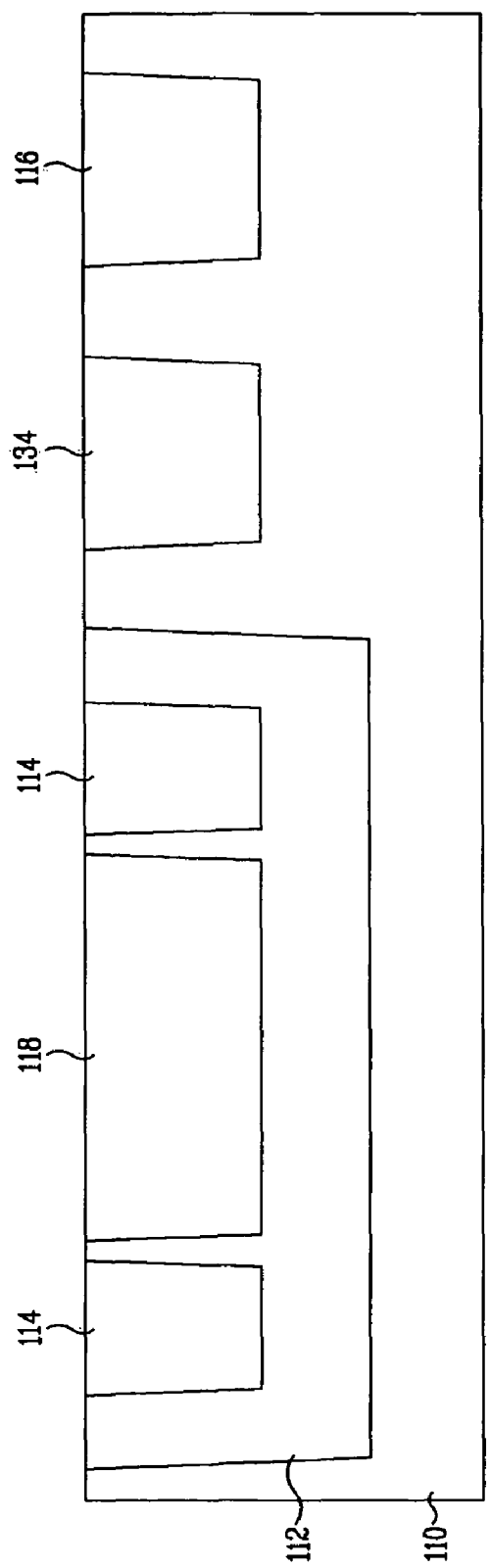

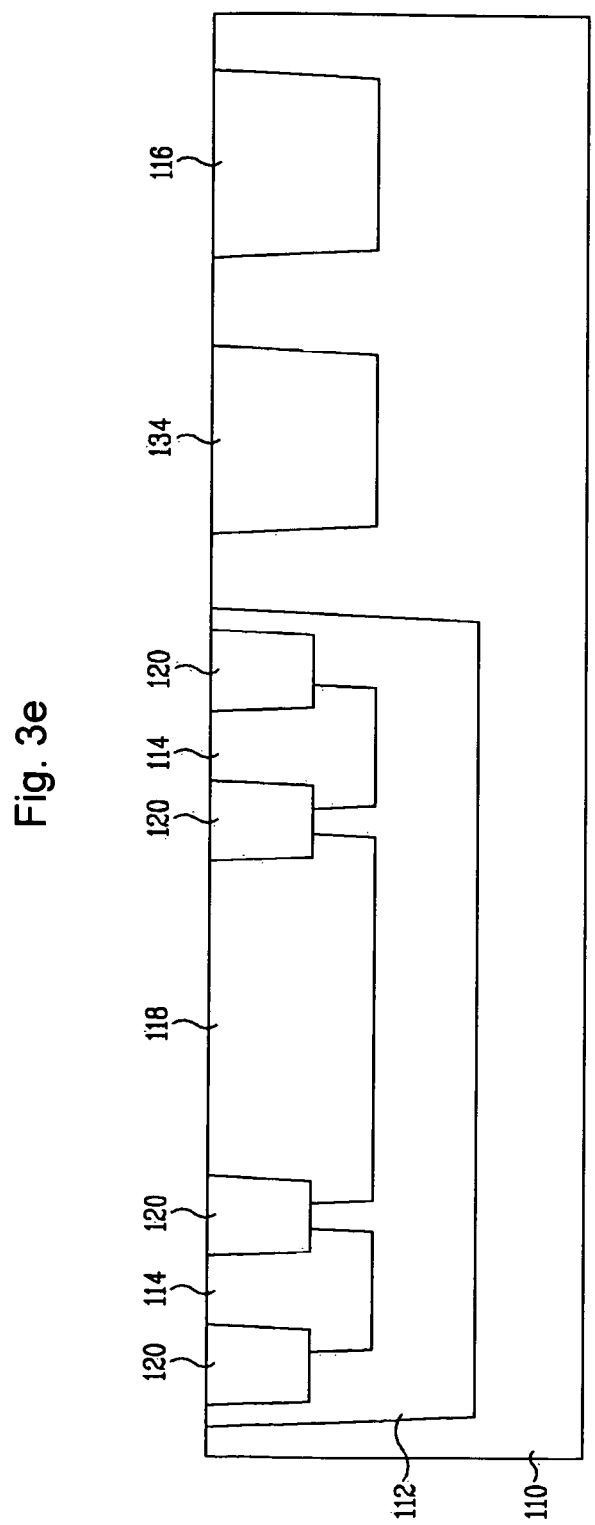

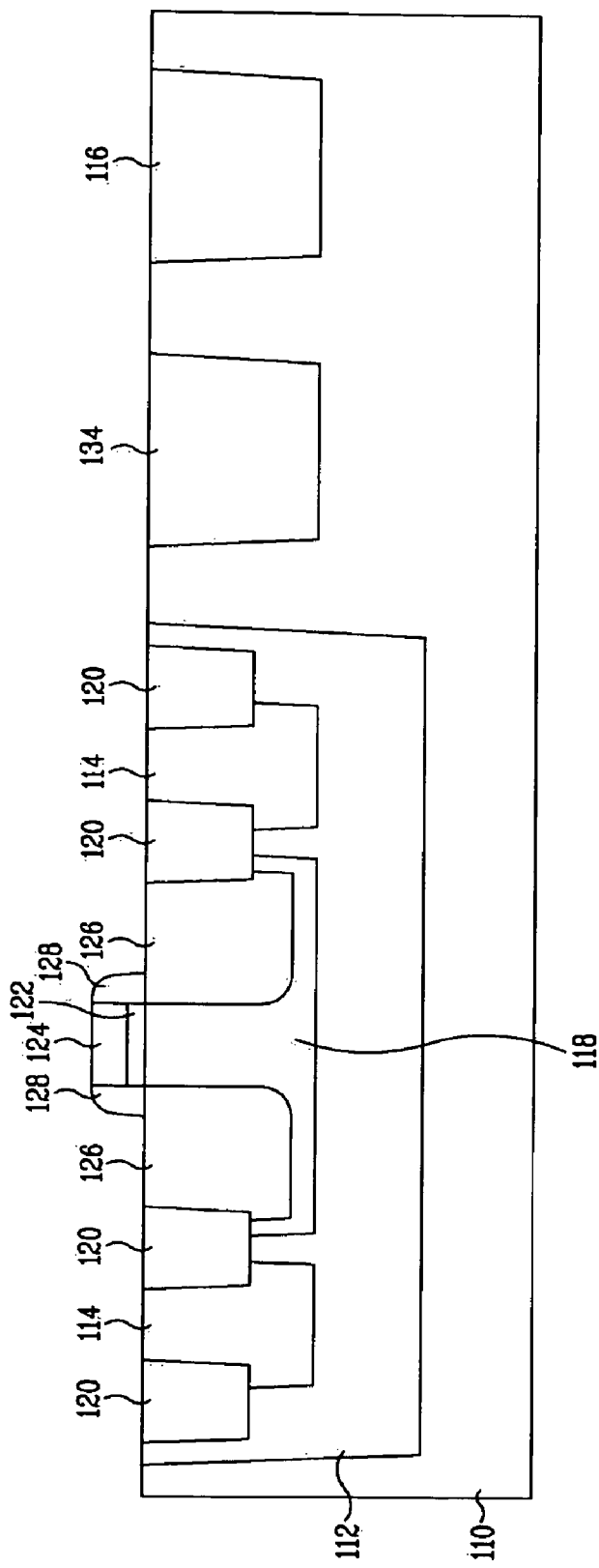

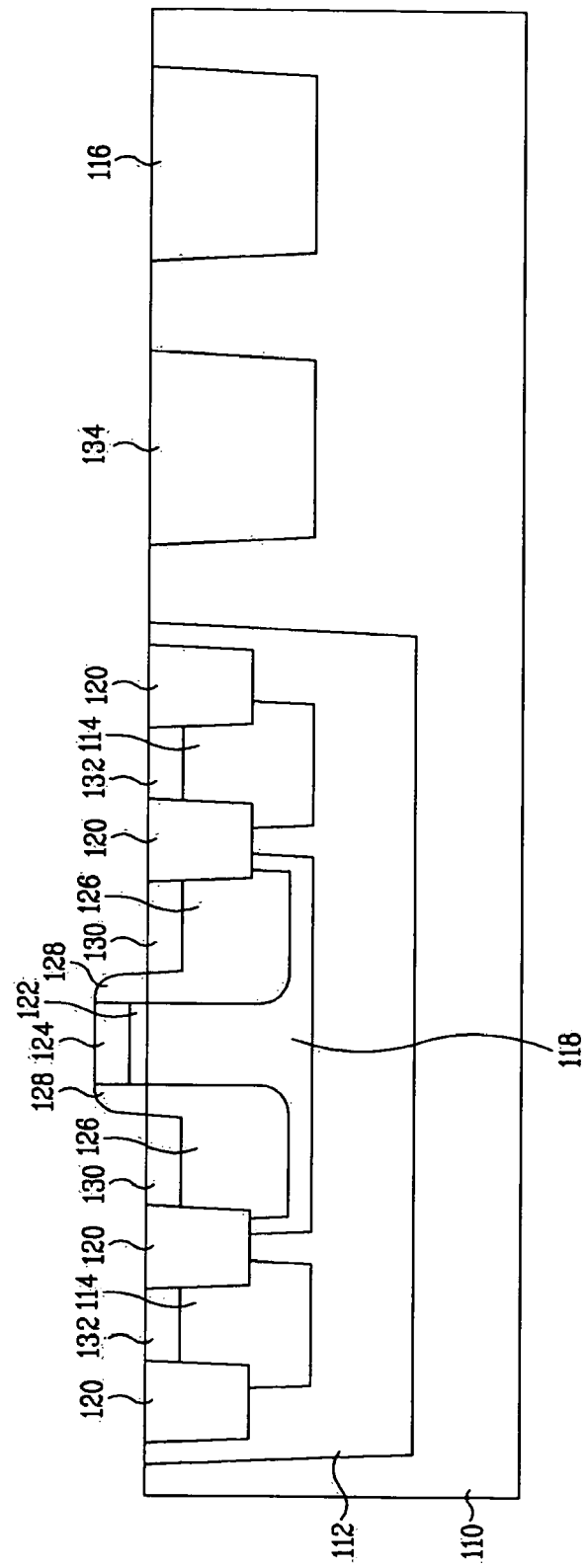

HIGH-VOLTAGE SEMICONDUCTOR DEVICE AND METHOD FOR MANUFACTURING THE SAME

This application claims the benefit of the Korean Patent Application No. 10-2007-0047440, filed on May 16, 2007 which is hereby incorporated by reference as if fully set forth herein.

BACKGROUND OF THE INVENTION

1. Field of the Invention

The present invention relates to a high-voltage semiconductor device and a method for manufacturing the same, and more particularly, to a high-voltage semiconductor device capable of applying a bulk bias to a high-voltage NMOS transistor included in the high-voltage semiconductor device and a method for manufacturing the same.

2. Discussion of the Related Art

Generally, semiconductor devices use a low voltage of 3.3V or less as a supply voltage, in order to achieve a reduction in power consumption and to secure a desired reliability. In a certain system, such a semiconductor device is connected with peripheral devices, which may use a high voltage of 5V or more. For this reason, the semiconductor device must be equipped with a high-voltage transistor to support a high input voltage supplied from outside of the system.

Such a high-voltage transistor typically has a MOS transistor structure, namely, the same structure as the low voltage transistor. The high-voltage transistor is formed simultaneously with the low voltage transistor, through a series of fabrication processes.

Hereinafter, a conventional high-voltage semiconductor device including a high-voltage transistor and a method for manufacturing the same will be described.

FIG. 1 is a sectional view illustrating a conventional high-voltage semiconductor device.

In order to manufacture the conventional high-voltage semiconductor device, a P type well 12 is first formed in a P type semiconductor substrate 10, as shown in FIG. 1. A mask (not shown) is then formed on the semiconductor substrate 10 such that isolation regions are exposed through the mask. The substrate regions exposed through the mask are then etched to form trenches. An insulating film is subsequently deposited to fill the trenches.

Thereafter, a chemical mechanical polishing (CMP) process is carried out such that the insulating film is left only in the trenches, to form isolation films 16.

Subsequently, an oxide film and a polysilicon film are sequentially formed over the resultant surface of the semiconductor substrate 10. The oxide film and polysilicon film are then patterned, to form a gate insulating film 18 and a gate electrode 20 on the semiconductor substrate 10 in a desired region.

N type low-concentration impurity ions are then implanted in the semiconductor substrate 10, to form lightly-doped N type impurity regions 14.

Thereafter, an insulating film for spacers, for example, a nitride film, is deposited over the resultant surface of the semiconductor substrate 10 including the gate electrode 20. The insulating film is then etched back, to form sidewall spacers 22 at side surfaces of the gate electrode 20 and gate insulating film 18.

In the semiconductor substrate 10 formed with the lightly-doped N type impurity region 14, high concentration impurity ions having the same conductivity as the lightly-doped N type impurity regions 14 are then implanted, to form heavily-doped N type impurity regions 24. Thus, source/drain electrodes are formed by the lightly-doped N type impurity regions 14 and heavily-doped N type impurity regions 24.

In the semiconductor device having the above-mentioned structure, it may be impossible to apply a bulk bias to the high-voltage NMOS transistor during normal operations. That is, the high-voltage NMOS transistor may have a problem in that it may not work when a plus bias is applied to the high-voltage NMOS transistor because both the well of the high-voltage NMOS transistor and the semiconductor substrate have a P type conductivity. For this reason, the semiconductor device may increase the complexity of an LCD driver IC (LDI) chip design and cause an increased chip size.

SUMMARY OF THE INVENTION

Accordingly, the present invention is directed to a high-voltage semiconductor device and a method for manufacturing the same that substantially obviate one or more problems due to limitations and disadvantages of the related art.

An object of the present invention is to provide a high-voltage semiconductor device and a method for manufacturing the same, which are capable of applying a bulk bias to a high-voltage NMOS transistor by forming deeply forming an N type well, forming an isolated P type well in the N type well, forming the high-voltage NMOS transistor in the P type well, and forming N type wells around the P type well.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a high-voltage semiconductor device may comprise: a semiconductor substrate; a first (high-voltage) N type well in the semiconductor substrate; a first (high-voltage) P type well in the first high-voltage N type well; second (high-voltage) N type wells in the first (high-voltage) N type well along a periphery of the first (high-voltage) P type well; a (high-voltage) gate insulating film and a gate electrode, on the first (high-voltage) P type well; and first heavily-doped N type impurity regions in the first (high-voltage) P type well at opposite sides of the gate electrode.

In another aspect of the present invention, a method for manufacturing a high-voltage semiconductor device comprises: forming a first (high-voltage) N type well in the semiconductor substrate; forming second (high-voltage) N type wells in the first (high-voltage) N type well along a periphery of the first (high-voltage) P type well; forming a first (high-voltage) P type well in a central portion of the first (high-voltage) N type well such that the first (high-voltage) P type well is isolated from the second (high-voltage) N type wells; forming an isolation film between the first (high-voltage) P type well and each of the second (high-voltage) N type wells; forming a (high-voltage) gate insulating film and a gate electrode on the first (high-voltage) P type well; and forming first heavily-doped N type impurity regions in the first (high-voltage) P type well at opposite sides of the gate electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings:

FIGS. 3A to 3I are sectional views illustrating processes for manufacturing the high-voltage semiconductor device according to the present invention.

DETAILED DESCRIPTION OF THE INVENTION

Reference will now be made in detail to the preferred embodiments of the present invention, examples of which are illustrated in the accompanying drawings.

Figure 1:
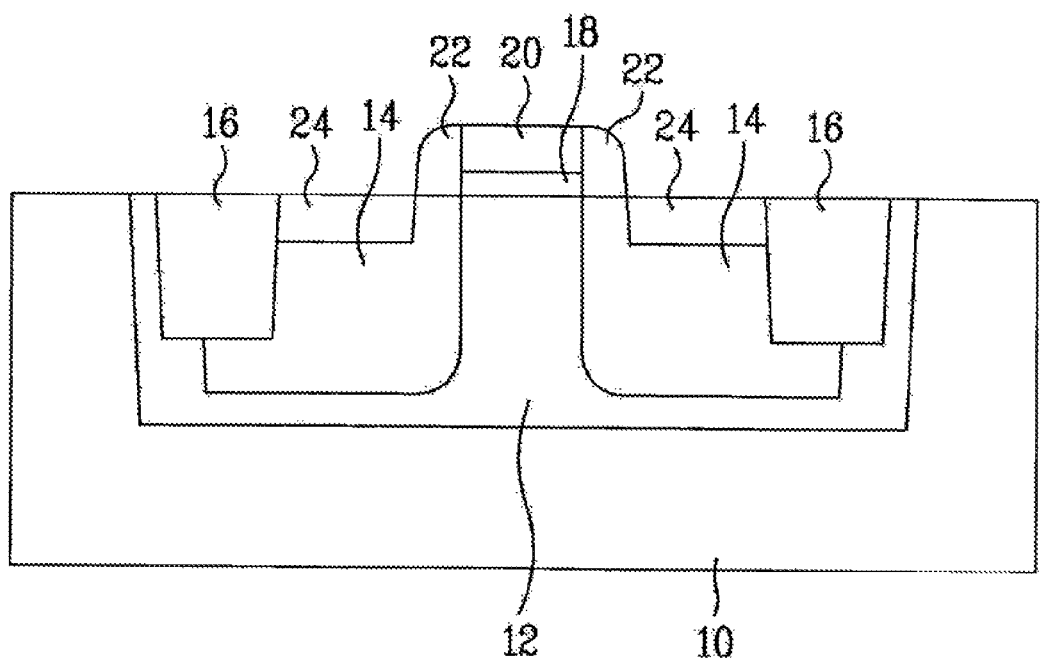
FIG. 1 is a sectional view illustrating a conventional high-voltage semiconductor device.
Figure 2:
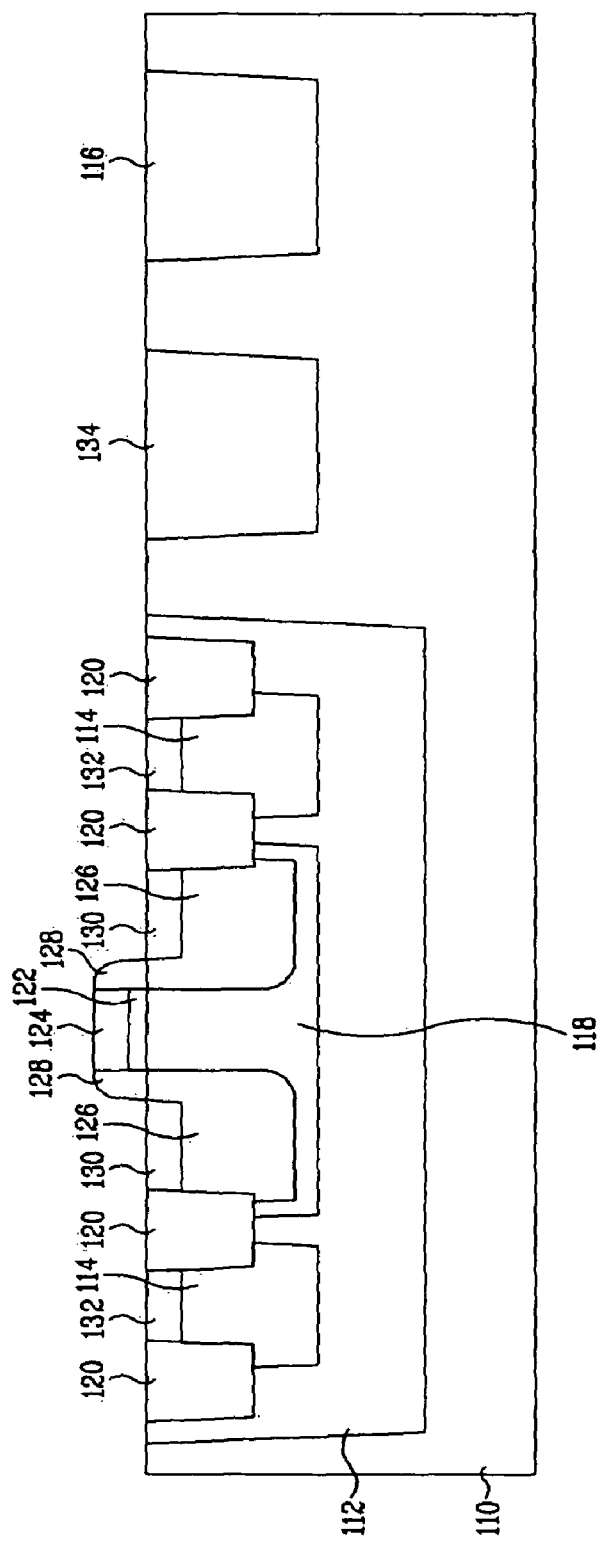
FIG. 2 is a sectional view illustrating a high-voltage semiconductor device according to the present invention.

FIG. 2 is a sectional view illustrating a high-voltage semiconductor device according to the present invention.

The high-voltage semiconductor device according to the present invention includes a semiconductor substrate 110, a first (high-voltage) N type well 112 formed in the semiconductor substrate 110, a first (high-voltage) P type well 118 formed in the first (high-voltage) N type well 112, and one or more second (high-voltage) N type wells 114 formed in the first (high-voltage) N type well 112 such that the second (high-voltage) N type well(s) 114 are isolated from the first (high-voltage) P type well 118. From a top-down or layout view, the second (high-voltage) N type well(s) 114 may form a single "ring" or square surrounding the first (high-voltage) P type well 118. Alternatively, the second (high-voltage) N type well(s) 114 may comprise a series of separate or discrete implantation zones or regions surrounding the first (high-voltage) P type well 118, with small gaps therebetween that do not substantially adversely affect the electrical isolation property of the second (high-voltage) N type well(s) 114 on the first (high-voltage) P type well 118.

In the present application, the phrase "(high-voltage)" refers to the fact that the well or other structure may be part of a high-voltage device, but that its properties and characteristics are not necessarily limited to use in a high-voltage device. Nonetheless, the high-voltage wells in the present device may have certain properties and/or characteristics, such as a depth, dopant, dose and/or profile, etc. that is advantageous for use in a high-voltage device. The high-voltage semiconductor device also includes a gate insulating film 122 and a gate electrode 124, which are stacked on the first (high-voltage) P type well 118 in a predetermined region, and source/drain electrodes formed by N type impurity ions implanted in the first (high-voltage) P type well 118 at opposite sides of the gate electrode 124. The gate insulating film 122 generally comprises a material and/or has a thickness adapted for use in a high-voltage device. For example, the thickness of the gate insulating film 122 may be 25-50% greater than that of a gate insulating film in a corresponding low voltage device (e.g., a semiconductor device in a core region of the chip or die, configured to operate at a power supply [Vcc] that is 20-50% lower than the corresponding power supply at which the high-voltage device operates). Other (high-voltage) structures may be similarly adapted for high voltage operation, relative to corresponding structures in low voltage transistors.

The high-voltage semiconductor device further includes lightly-doped N type impurity regions 126 formed in the first high-voltage P type well 118 at opposite sides of the gate electrode 124 beneath the gate electrode 124, sidewall spacers 128 formed at side surfaces of the gate insulating film 122 and gate electrode 124, first heavily-doped N type impurity regions 130 respectively formed in the lightly-doped N type impurity regions 126 beneath and largely outside the sidewall spacers 128, and one or more second heavily-doped N type impurity regions 132 respectively formed in or on the second high-voltage N type well(s) 114. In one embodiment, the layout of the second heavily-doped N type impurity region(s) 132 corresponds to the layout of the second high-voltage N type well(s) 114.

Each second (high-voltage) N type well 114 is isolated from the first (high-voltage) P type well 118 by an isolation film 120. The isolation film 120 may also be formed outside each second high-voltage N type well 114, to isolate the second high-voltage N type well 114 from other elements (such as transistors) outside the second (high-voltage) N type well 114.

Outside the first (high-voltage) N type well 112, a second (high-voltage) P type well 134 and a third (high-voltage) N type well 116 may be formed. Although not shown, another element (such as other high-voltage transistors and/or one or more low-voltage transistors) can be formed in each of the wells 134 and 116.

The first (high-voltage) N type well 112, first (high-voltage) P type well 118, and the second (high-voltage) N type well(s) 114 may have a relatively low ion concentration. The first (high-voltage) N type well 112 has a highest or greatest depth, as compared to the remaining wells 118 and 114. In the first (high-voltage) N type well 112, the first (high-voltage) P type well 118 and the second high-voltage N type well(s) 114 are formed.

The first (high-voltage) P type well 118 may be formed in a central portion of the first (high-voltage) N type well 112. The second (high-voltage) N type well(s) 114 are generally formed around the first (high-voltage) P type well 118. Thus, the first (high-voltage) P type well 118 can be electrically isolated from other elements outside the first (high-voltage) N type well 112. In this case, it is difficult for the first (high-voltage) N type well 112 to provide a lateral isolation function because the ion concentration thereof is low. In order to complement the lateral isolation function and to reduce a resistance generated upon application of a bias, the second (high-voltage) N type well(s) 114 are formed outside the first (high-voltage) P type well 118.

Hereinafter, a method for manufacturing the high-voltage semiconductor device in accordance with the present invention will be described with reference to the accompanying drawings.

FIGS. 3A to 3I are sectional views illustrating processes of the high-voltage semiconductor device according to the present invention.

Figure 3A:
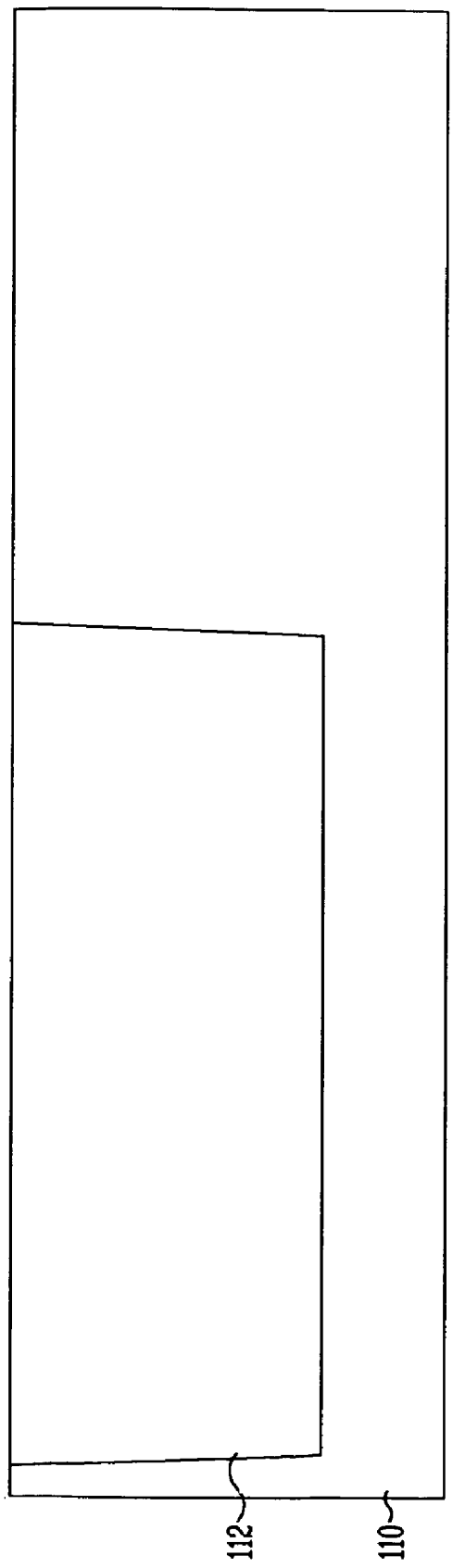

In accordance with the method, as shown in FIG. 3A, phosphorous ions (or other N type ions, such as As or Sb) are implanted in the semiconductor substrate 110 in a predetermined region, using a mask (not shown), and are then subjected to an annealing process, to form the first (high-voltage) N type well 112 in the semiconductor substrate 110. The implantation of phosphorus ions is carried out at energy of about 2,000 keV such that the first (high-voltage) N type well 112 has a low ion concentration and a relatively high depth.

Figure 3B:
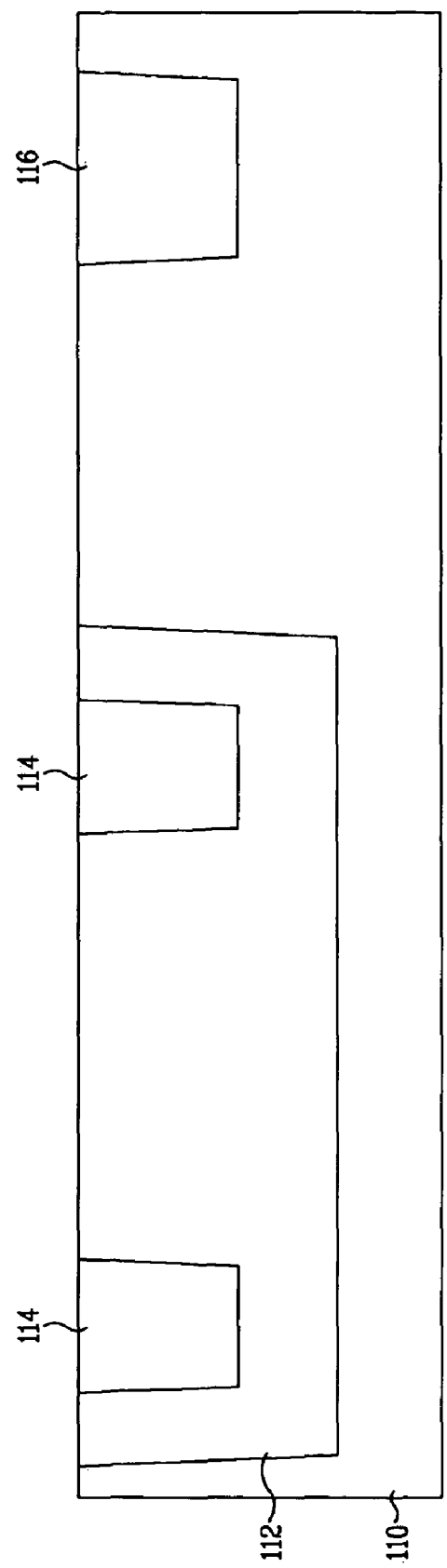

Thereafter, phosphorus ions (or other N type ions, such as As or Sb) are implanted in a low concentration in the semiconductor substrate 110 at energy of about 1,000 keV, using a mask (not shown), to form the second (high-voltage) N type well(s) 114 in the first (high-voltage) N type well 112, generally near a peripheral edge of the first (high-voltage) N type well 112, as shown in FIG. 3B. At the same time, a third N type well 116 can be formed outside the first (high-voltage) N type well 112. Although an element separate from the first (high-voltage) N type well 112 is generally formed in the third N type well 116, no description will be given herein of the associated process.

Boron ions are then implanted in the semiconductor substrate 110, using a mask (not shown), to form the first (high-voltage) P type well 118 in a central portion of the first (high-voltage) N type well 112 (and also generally inside the second N type well[s] 114) such that the first high-voltage P type well 118 is isolated from the second high-voltage N type wells 114, as shown in FIG. 3C.

In order to subsequently form the second P type well 134 outside the first (high-voltage) N type well 112, as shown in FIG. 3D, boron ions are implanted in the semiconductor substrate 110, using a mask (not shown), and are then subjected to an annealing process. Although an element separate from the first (high-voltage) N type well 112 is formed in the second P type well 134, no description will be given herein of the associated process.

The first high-voltage P type well 118 and the second high-voltage P type well 134 may be formed in different processes, respectively, in order to enable the wells 118 and 134 to have the same ion concentration. If boron ions are implanted in regions corresponding to the first (high-voltage) P type well 118 and second P type well 134 simultaneously form the first (high-voltage) P type well 118 and second P type well 134, the first (high-voltage) P type well 118 exhibits an ion concentration lower than the second P type well 134. This is because the first (high-voltage) P type well 118 is formed within the first (high-voltage) N type well 112. Therefore, in order to form the first (high-voltage) P type well 118 and second P type well 134 such that they have the same ion concentration, it is necessary to implant boron ions in different processes using different ion dosages for the wells 118 and 134, respectively. However, if the dopant concentration difference does not matter for a particular application, one may of course form P wells 118 and 134 at the same time using a single mask.

Thereafter, a pad nitride film (not shown) is deposited over the semiconductor substrate 110. Subsequently, the pad nitride film is patterned in accordance with photolithography and etch processes, to expose isolation regions of the substrate 110. The semiconductor substrate 110 is then etched in the exposed regions, to form trenches (not shown). An insulating film (generally silicon dioxide) is then deposited to fill the trenches. Thereafter, the insulating film is polished in accordance with a CMP process until a predetermined thickness of the insulating film is left on the pad nitride film. Thus, the isolation films 120 are formed, as shown in FIG. 3E. The pad nitride film is then etched to be completely removed. Alternatively, the isolation films 120 can be formed earlier in the process (e.g., at any time prior to the formation of the gate insulation layer; see the discussion of FIG. 3f below).

Through the above-described processes, one isolation film 120 may be formed between the first (high-voltage) P type well 118 and each second (high-voltage) N type well 114. Also, another isolation film 120 can be formed at the same time between each second (high-voltage) N type well 114 and an element outside the second (high-voltage) N type well 114.

Figure 3F:
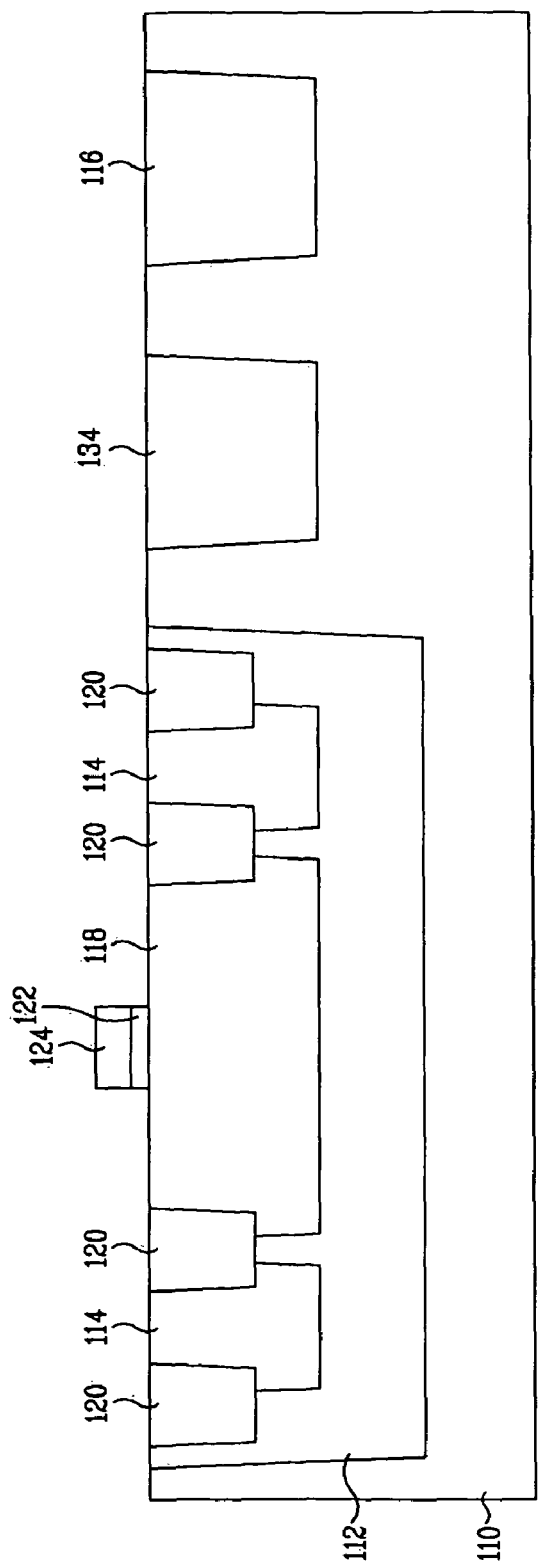

Thereafter, an oxide film and a polysilicon film are sequentially stacked over the resultant surface of the semiconductor substrate 110, and are then patterned to form the high-voltage gate insulating film 122 and gate electrode 124 on a predetermined portion of the first high-voltage P type well 118, as shown in FIG. 3F. Generally, the high-voltage gate insulating film 122 is grown by thermal oxidation of exposed silicon (e.g., of the substrate 110), and the polysilicon film is formed by chemical vapor deposition (CVD, which may be plasma-assisted or plasma-enhanced) from a silicon precursor, such as silane gas.

Figure 3G:
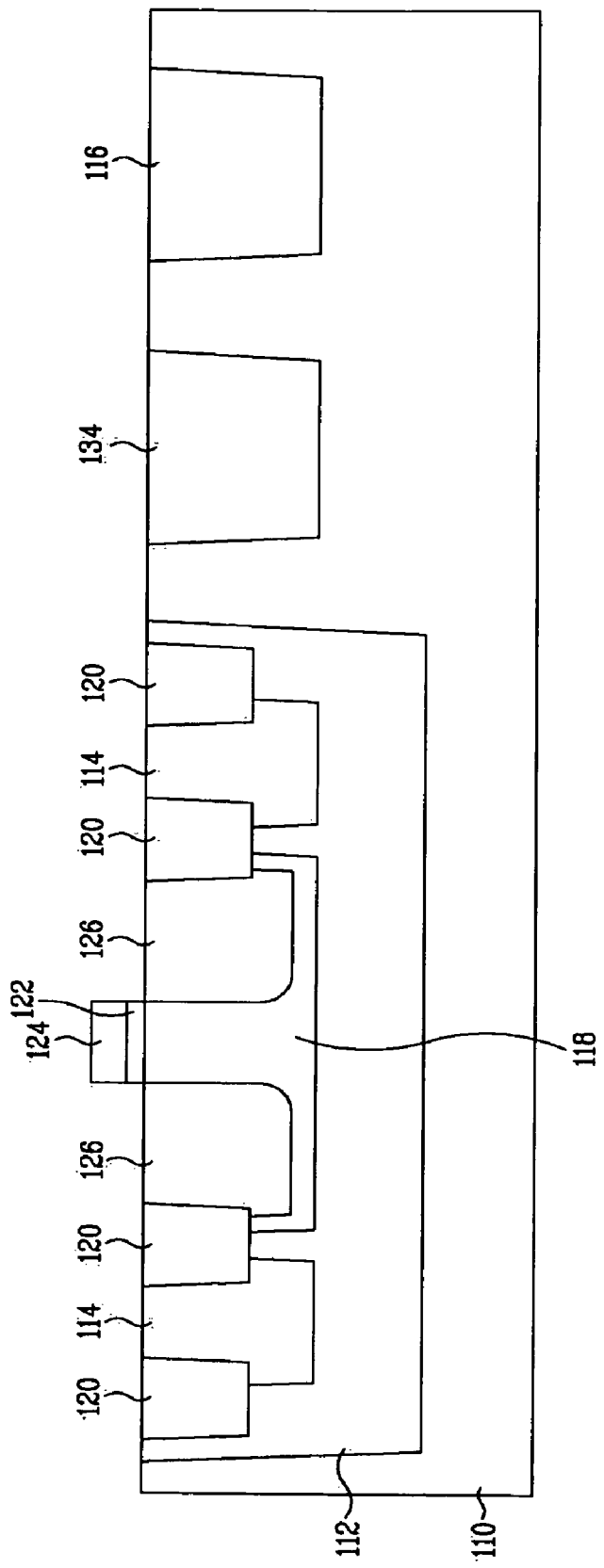

Phosphorous (or other N type) ions are then implanted in a low concentration in the semiconductor substrate 110, using the high-voltage gate insulating film 122 and gate electrode 124 as a mask (and optionally with another material stacked thereon, which is not shown in the Figures), to form the lightly-doped N type impurity regions 126 around the gate electrode 124 in the first (high-voltage) P type well 118, as shown in FIG. 3G. In this case, each lightly-doped N type impurity region 126 may be considered to be a lightly-doped drain (LDD) region.

Thereafter, an insulating film for spacers, for example, a nitride film, an oxide-nitride stack, or an oxide-nitride-oxide stack, is deposited over the resultant surface of the semiconductor substrate 110 including the gate electrode 124, and is then etched back, to form the sidewall spacers 128 at side surfaces of the gate electrode 124 and gate insulating film 122, as shown in FIG. 3H. Subsequently, in the semiconductor substrate 110 having the lightly-doped N type impurity regions 126 therein, impurity ions having the same conductivity as the lightly-doped N type impurity regions 126 are implanted in a relatively heavy dose to form the first heavily-doped N type impurity regions 130 in the lightly-doped N type impurity regions 126 beneath and generally outside the sidewall spacers 128, to form the second heavily-doped N type impurity regions 132 in the second (high-voltage) N type wells 114. Thus, source/drain electrodes, which are formed by the lightly-doped N type impurity regions 126 and heavily-doped first N type impurity regions 130, are completed.

In the high-voltage semiconductor device manufactured in the above-described processes, it is possible to apply a bulk bias to the first high-voltage P type well 118 by applying a bias to the second high-voltage N type well(s) 114. In this case, each second high-voltage N type well 114 functions to isolate the first high-voltage N type well 112 from other elements in the semiconductor substrate 110, for example, the second P type well 134 and third N type well 116.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

As apparent from the above description, the high-voltage semiconductor device manufactured in accordance with the present invention provides the following effects.

First, it is possible to apply a bulk bias to a high-voltage NMOS transistor in the high-voltage semiconductor device by deeply forming an N type well, forming an isolated P type well in the N type well, forming a (high-voltage) NMOS transistor in the P type well, and forming one or more N type wells around the P type well.

Second, an improvement in punch-through breakdown voltage in the P type well in the lightly-doped deep N type well can be achieved.

Third, it is possible to reduce the field of the heavily-doped N type impurity region, and achieve a reduction in resistance.

What is claimed is:

1. A method for manufacturing a high-voltage semiconductor device, comprising:
    forming a first N type well in the semiconductor substrate;
    forming (i) one or more second N type wells in the first N type well and (ii) a third N type well in the semiconductor substrate outside the first N type well;
    forming a first P type well in a central portion of the first N type well such that the first P type well is isolated from the second N type well(s), the second N type well(s) being along a periphery of the first P type well;
    after forming the first P type well, forming a second P type well in the semiconductor substrate outside the first N type well, wherein the first P type well and the second P type well have a same concentration;
    forming a gate insulating film and a gate electrode on the first P type well; and
    forming first heavily-doped N type impurity regions in the first P type well at opposite sides of the gate electrode.

2. The method according to claim 1, further comprising:
    forming second heavily-doped N type impurity regions in the second N type well(s).

3. The method according to claim 2, wherein the second heavily-doped N type impurity regions are formed simultaneously with the first heavily-doped N type impurity regions.

4. The method according to claim 1, wherein the first heavily-doped N type impurity regions form source/drain electrodes.

5. The method according to claim 1, further comprising:
    forming lightly-doped N type impurity regions in the first P type well at opposite sides of the gate electrode beneath the gate electrode, respectively, after forming the gate insulating film and gate electrode.

6. The method according to claim 5, further comprising:
    forming sidewall spacers at side surfaces of the gate insulating film and gate electrode after forming the lightly-doped N type impurity regions.

7. The method of claim 6, wherein the first heavily-doped N type impurity regions are formed after forming the sidewall spacers.

8. The method of claim 5, wherein the first heavily-doped N type impurity regions are formed in the lightly-doped N type impurity regions.

9. The method according to claim 1, further comprising forming one or more first isolation films between the first P type well and the second N type well(s).

10. The method of claim 9, further comprising forming one or more second isolation films between the second N type well(s) and an element outside the second N type well(s).

11. The method of claim 10, wherein the first and second isolation films are formed simultaneously.

12. The method according to claim 1, wherein one or more of the first N type well, the first P type well, and the one or more second N type wells have one or more properties and/or characteristics adapted for high-voltage operation.

13. The method according to claim 1, wherein the gate insulating film has a thickness adapted for high-voltage operation.

14. The method according to claim 1, wherein the one or more second N type wells comprise a single ring or square surrounding the first P type well.

15. The method according to claim 1, wherein the one or more second N type wells comprise a series of separate or discrete zones or regions surrounding the first P type well.

16. The method according to claim 1, wherein the first N type well has a greater depth than the first P type well and the second N type well(s).

17. The method according to claim 1, wherein forming the first N type well comprises implanting phosphorus ions at an energy of about 2000 keV.

18. The method according to claim 17, wherein forming the second and third N type wells comprises implanting phosphorus ions at an energy of about 1000 keV.

* * * * *